United States Patent [19]

Mueller

[11] Patent Number: 4,553,190

[45] Date of Patent: Nov. 12, 1985

[54] TRANSPARENT CONTAINER FOR ELECTROSTATIC SENSITIVE ELECTRONIC COMPONENTS

[75] Inventor: Gerald E. Mueller, Minneapolis, Minn.

[73] Assignee: Minnesota Mining and Manufacturing Co., St. Paul, Minn.

[21] Appl. No.: 411,348

[22] Filed: Aug. 26, 1982

[51] Int. Cl.$^4$ .............................................. H05F 1/00
[52] U.S. Cl. ..................................... 361/212; 206/328
[58] Field of Search ................ 361/212, 220; 206/328, 206/329, 331, 334; 174/35 R, 35 MS

[56] References Cited

U.S. PATENT DOCUMENTS

| | | | |
|---|---|---|---|
| 3,094,436 | 6/1963 | Schröder | 361/212 X |
| 4,037,267 | 7/1977 | Kisor | 361/220 |
| 4,154,344 | 5/1979 | Yenni, Jr. et al. | |
| 4,156,751 | 5/1979 | Yenni, Jr. et al. | |
| 4,166,876 | 9/1979 | Chiba et al. | |
| 4,327,832 | 5/1982 | de Matteo | |

FOREIGN PATENT DOCUMENTS 54-65694  5/1979  Japan ................................. 206/328
2081226  7/1981  United Kingdom .

OTHER PUBLICATIONS

Thielex Literature.
TRW Literature.
Semiconductor Replacement Guide–published by Tandy Corporation, Ft. Worth, TX ©1979.

Primary Examiner—Harry E. Moose, Jr.
Attorney, Agent, or Firm—Donald M. Sell; James A. Smith; William D. Bauer

[57] ABSTRACT

A container (10) for longitudinally receiving a plurality of electrostatic sensitive electronic components (12) having a rigid, transparent, elongated channel (14) being open on at least one end. The channel (14) has a transparent, insulative layer (22) and a transparent conductive layer (24) at least partially transversely surrounding the electrostatic sensitive electronic components (24). Optionally, the interior surface of the channel 14 may contain an antistatic layer (27). Further optionally, the exterior surface of the container may contain a transparent protective layer (26).

24 Claims, 13 Drawing Figures

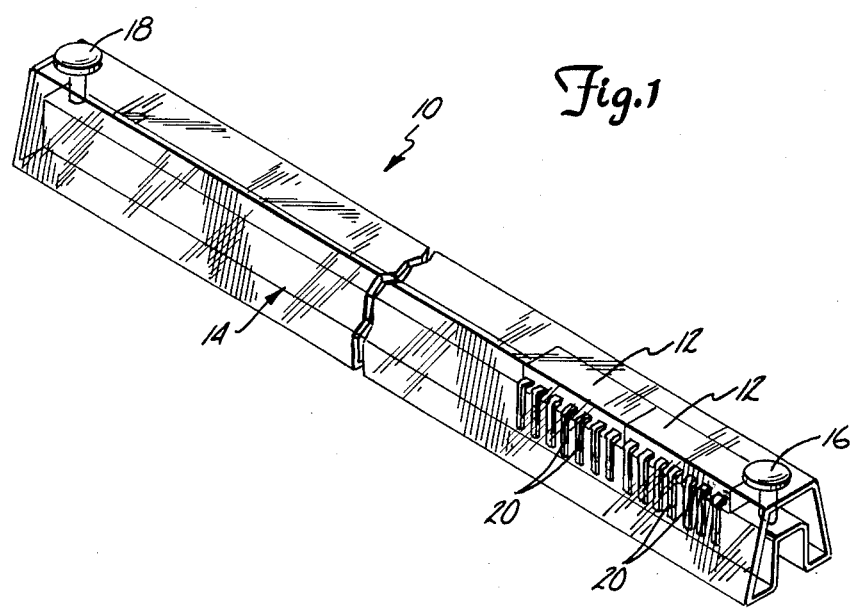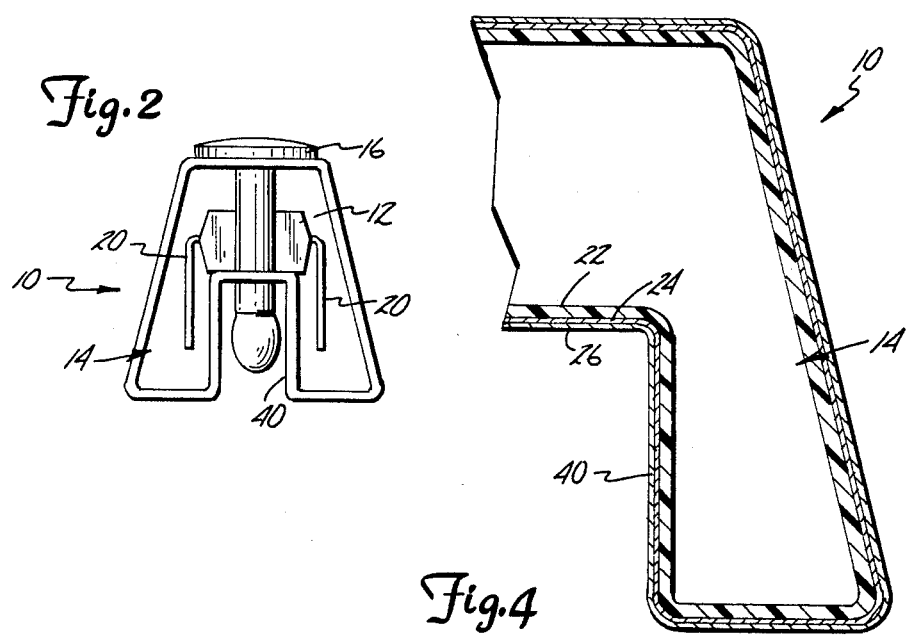

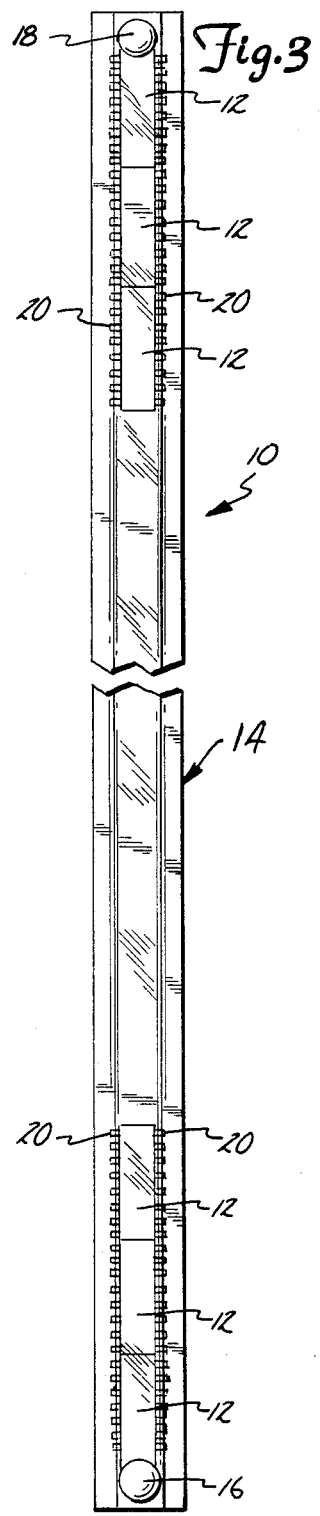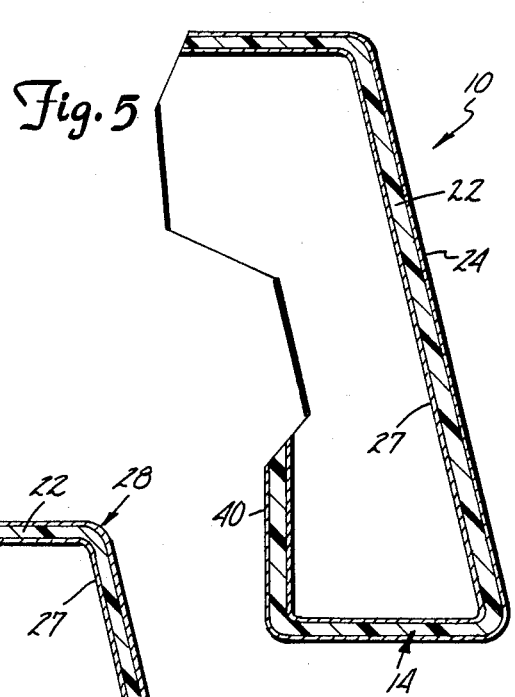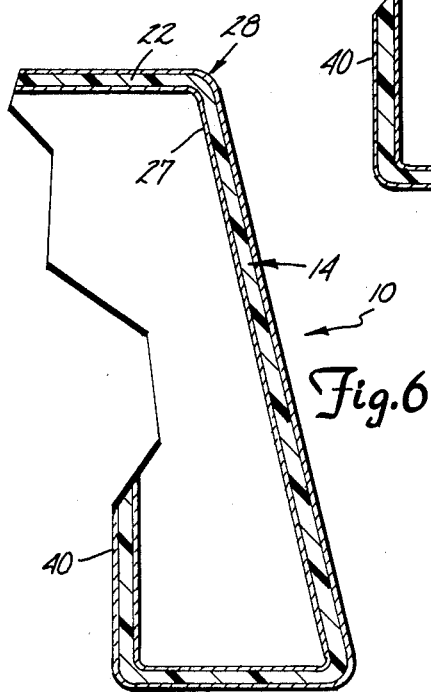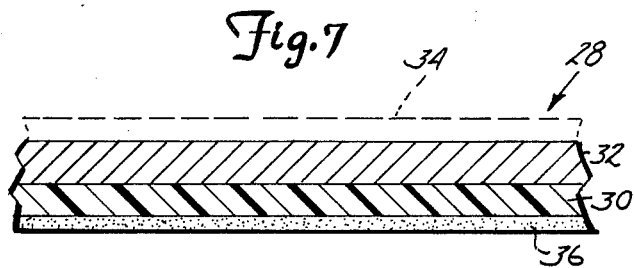

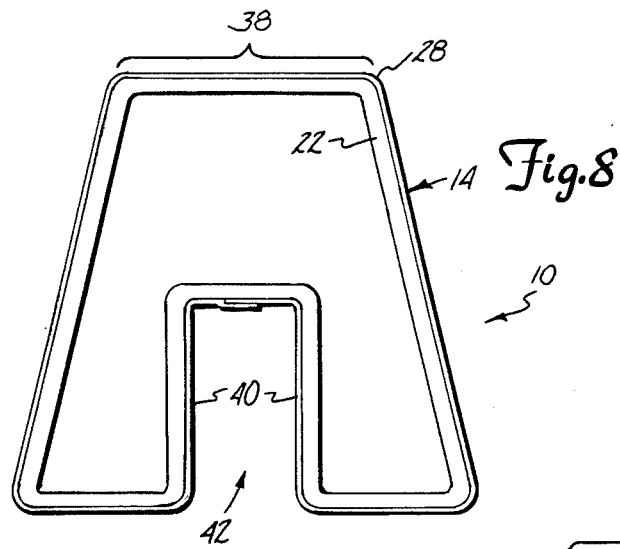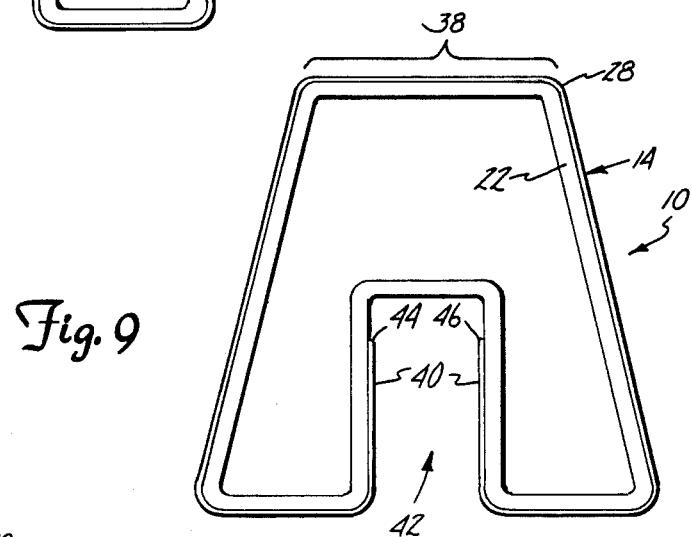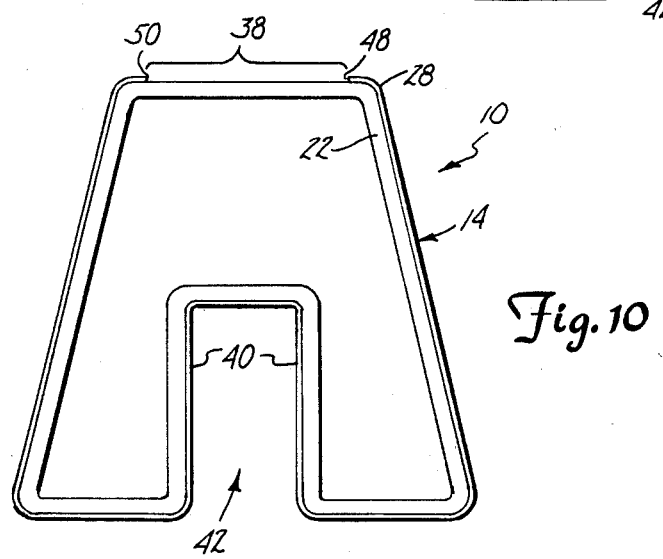

TRANSPARENT CONTAINER FOR ELECTROSTATIC SENSITIVE ELECTRONIC COMPONENTS

BACKGROUND OF THE INVENTION

The present invention relates generally to containers for holding electronic components and more particularly to containers for holding electrostatic sensitive electronic components.

Containers for holding electronic components are well known in the art. Such containers longitudinally stack such electronic components in an end to end relationship. Typically these containers restrict component rotation within the container and provide for easy slidability of the component longitudinally with respect to the container. One example of a component and a container therefor is a dual in-line package (DIP) electronic component and its container, the DIP tube.

Generally such containers or DIP tubes are transparent rather than opaque. The transparency allows easy identification of and count of electronic components contained therein and allows visual inspection of damage in the form of deformed leads. Some of these transparent containers, DIP tubes, are constructed from a material which contains an antistatic agent to help prevent the electrostatic charging of portions of the electronic component.

Recently, electronic components have become much more sensitive to electrostatic discharge. Several attempts have been made within the electrostatic sensitive electronic component container art to address this problem.

One solution is to add enough of a conductive agent, typically carbon black, to a plastic material forming the container to achieve conductivity and therefore, electrostatic protection of the contained electronic component. Carbon black, however, typically renders the plastic into which it is introduced opaque, namely, black. With an opaque container the electronic components contained therein are no longer visible and it is no longer easy to identify the type of electronic component contained therein, nor to obtain an accurate count without removal of the electronic components and possible subsequent damage thereto.

Similarly containers, DIP tubes, can be constructed from a conductive metal, e.g. aluminum. Typical metals conductive enough to maintain electrostatic protection of the electronic components contained therein. But again, such containers constructed from a metal material are opaque and again, the electronic components contained therein are no longer visible.

Another solution is to provide only a partial transverse electrostatic protection. One particular container manufactured by Wescorp, division of DAL Industries, Inc., 1115 Terra Bella Avenue, Mountain View, Calif., has an open slot extending longitudinally along the top of the DIP tube. A container manufactured by Thielex, 201 Eleventh Street, Piscataway, N.J., is a dual extruded (co-extruded) DIP tube with an opaque conductive body portion and a transparent non-conductive windowpane portion, again along the top of the tube. Both of these containers provide some degree of electrostatic protection to the electronic component contained therein even though neither one completely transversely surrounds the electrostatic sensitive components with a conductive material. Such electrostatic protection may be sufficient for some electronic components in some applications. Both containers allow for visibility of the electronic components contained therein for identifying type and for obtaining an accurate count. Further, such a container with an open slot or a transparent windowpane portion allows for visibility of only a portion of the electronic components contained therein. In both of these containers only the top of the electronic components would be visible, while the remainder of the electronic component would not be visible, e.g., the leads of the electronic component. This consideration is important when containers are used with automatic insertion equipment and the format and quality of the component leads is essential for the proper functioning of the automatic insertion equipment. If the leads of the electronic components cannot be ascertained without extracting the electronic component from the container, either the electrostatic protection of the component or the automatic insertability of the component may be jeopardized.

It is to be noted that none of the prior art containers achieve a fully electrostatic shielded electronic component while allowing a full transverse visual identification of the electronic component.

SUMMARY OF THE INVENTION

A container is provided which is adapted to receive a plurality of electrostatic sensitive electronic components. The container is made of a rigid, hollow, transparent, elongated channel being open on at least one end. The channel has a transparent, insulative layer and a transparent, conductive layer, at least partially transversely surrounding the electrostatic sensitive electronic components. Further the interior surface of the channel may be made antistatic, in a preferred embodiment having a surface resistivity of from $10^7$ to $10^{14}$ ohms per square. In preferred embodiments, the conductive layer has a surface resistivity of not more than $10^6$ ohms per square and the insulative layer has a volume resistivity of at least $10^9$ ohms-centimeters. In a preferred embodiment, a transparent, protective layer may be formed on the exterior surface of the container. In a preferred embodiment, the conductive layer completely transversely surrounds the electronic components. The conductive layer, in a preferred embodiment, may be oriented opposite the insulative layer from the interior surface of the container.

A container so constructed allows both full electrostatic shielding (via the conductive layer) of the electrostatic sensitive electronic components with full visual identification and inspection of the components. Further, the container prevents direct coupling of an electric potential or electrostatic discharge to the electronic component (insulative layer). The container may also have an antistatic interior surface to help prevent triboelectric charging of its contents, e.g. while the component is sliding within the container. In situations not requiring full transverse electrostatic shielding the opportunity is open to allow for greater visibility to the electronic component and/or to obtain easier fabrication techniques and still provide component identification along with component lead examination capability.

BRIEF DESCRIPTION OF THE DRAWINGS

The foregoing advantages, construction and operation of the present invention will become more readily apparent from the following description and accompanying drawings in which:

FIG. 1 is an isometric view of a container, DIP tube;

FIG. 2 is an end view of the container of FIG. 1 with an exemplary electronic component contained therein;

FIG. 3 is a top view of the container of FIG. 1 with a plurality of electronic components contained therein;

FIG. 4 is a cross-section showing a preferred material construction for a container of the present invention;

FIG. 5 is a cross-section showing an alternative material construction of a container of the present invention;

FIG. 6 is a cross-section showing an alternative material construction of a container of the present invention;

FIG. 7 is a cross-section of an electrostatic shielding film which may be utilized in the construction of a container of the present invention;

FIG. 8 is a cross-section showing a preferred application of the static shielding film of FIG. 7 to a container of the present invention;

FIG. 9 is a cross-section showing alternative application of the static shielding film of FIG. 7 to a container of the present invention;

FIG. 10 is a cross-section showing an alternative application of the static shielding film with FIG. 7 to a container of the present invention;

DETAILED DESCRIPTION OF THE PREFERRED EMBODIMENTS

Figure 11:
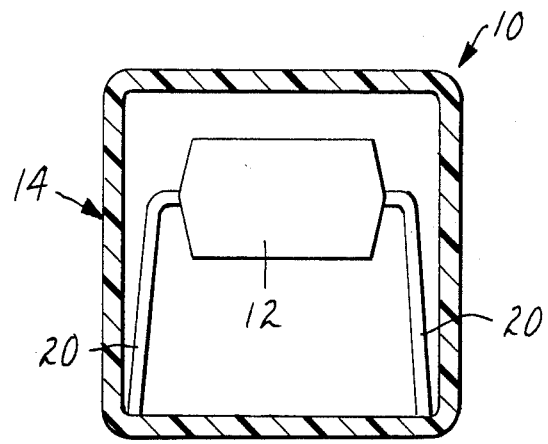
FIG. 11 is a cross-section of an alternative shape for the container of the present invention.

FIGS. 1, 2, and 3 illustrate a container 10 receiving a plurality of electrostatic sensitive electronic components 12. The electronic components 12 are arranged longitudinally end to end. The container 10 is comprised of a rigid, elongated channel 14 in a general A-shape. The A-shape of the channel 14 is designed particularly to receive a particular form of the electrostatic sensitive electronic components 12. The electronic components 12 illustrated in FIGS. 1 through 3 are a dual in-line package (DIP) components which is one of several varieties of electronic components currently available. The A-shape for the channel 14 is chosen because it easily receives the electronic components 12 and prevents the components 12 from rotating within the container 10. It is to be recognized and understood that other forms of electronic components 12 are available and that the cross-sectional shape of the channel 14 is not crucial for the performance of the present invention. Virtually any cross-sectional shape is permissible which will contain the electronic components 12 in a longitudinal, slidable basis. It is preferred that the channel 14 be shaped and sized such that the electronic components 12 are unable to rotate significantly about the longitudinal axis. Such limitation in the degree of rotation of the electronic components 12 will permit the container 10 to be utilized with components 12 destined for use in automatic insertion equipment and further allows for easier identification of type due to the uniform orientation. Channel 14 is shown being open on either end. It is only a requirement of the present invention that the channel 14 be open on at least one end to be able to receive the electronic components 12. A plug 16 is shown at one end of the channel 14 which may be inserted into the channel 14 to hold the electronic components 12 within the channel when the plug 16 is inserted. Similarly plug 18 performs the same function at the opposite end. Additionally plugs 16 and 18 space the end electronic component 12 a predetermined distance away from the open end of the channel 14. This spacing may be preferable in order to more sufficiently protect the end electronic component 12 from external electrostatic discharges or effects of the resulting fields. While the container 10 in FIGS. 1 through 3 is shown being open on both ends, it is recognized and understood that one end may be completely closed or that alternative forms of temporary closure other than the plugs 16 and 18 may be developed by those with ordinary skill in the art.

The container 10 while providing full electrostatic shielding for the electrostatic sensitive electronic components 12 is transparent allowing full visibility and identification of the electronic components 12 particularly of the type number which is usually stamped on the top of the body of the electronic component 12 and of the leads 20 of the electronic component 12.

FIG. 4 illustrates one example of a preferred construction of the material forming the channel 14. Channel 14 is formed of two primary components, an insulative layer 22 and a conductive layer 24. Both the insulative layer 22 and the conductive layer 24 are transparent which is critical for providing the transparent container 10. Insulative layer 22 must be sufficiently an insulator to prevent direct coupling of external electrical potentials of a sufficient magnitude to damage the electronic components 12 contained therein in the environment to which the container 10 is subjected. In a preferred embodiment, insulative layer 22 has a volume resistivity of at least $10^9$ ohm-centimeters. Insulative layer 22 may be formed of any of a variety of plastic materials, for example polyvinylchloride. Conductive layer 24 must be sufficiently conductive to provide a Faraday cage-like effect to provide effective electrostatic shielding for the electronic components contained in the container 10. In a preferred embodiment, the conductive layer 24 has a surface resistivity of not more than $10^6$ ohms per square. In a preferred embodiment, the conductive layer 24 may be formed by sputtering or vapor coating a thin conductive material, e.g., nickel, aluminum or indium tin oxide, onto the insulative layer 22. It has been found that such sputtering or vapor coating having a thickness of approximately 50 to 500 Angstroms will provide sufficient conductivity while also affording sufficient transparency. For the purposes of this invention a total transparency for one thickness of channel 14 providing approximately 40 percent visible light transmission is to be considered transparent. Again, the insulative layer 22 will provide protection against direct coupling of external electrical potentials while conductive layer 24 will provide for electrostatic shielding of the electronic components 12 contained therein As shown in FIG. 4, insulative layer 22 is shown toward the interior of channel 14 while conductive layer 24 is shown toward the exterior. The particular orientation of these layers is not crucial, however, although the preferred orientation has been shown. Optionally shown in FIG. 4, a transparent protective layer 26 is shown on the exterior surface of channel 14. A protective layer 26 may be desirable to provide abrasion resistance to a conductive layer 24 or to provide protection against exterior corrosive elements particularly where the conductive layer 24 is exterior to the insulative layer 22. It is generally preferred that insulative layer 22 be located interior to conductive layer 24 to help prevent direct electrical coupling between the conductive layer 24 and the electronic components 12.

FIG. 5 illustrates an alternative construction for the channel 14 utilized to construct the container 10. As in the channel 14 of FIG. 4, the channel 14 in FIG. 5 is constructed from an insulative layer 22 and a conductive layer 24 external to the insulative layer 22. Insulative layer 22 protects against direct coupling of an external electric potential to the electronic component 12 (not shown) contained therein while conductive layer 24 provides for effective electrostatic shielding of the electronic component 12 (not shown). Similar considerations for the construction and orientation of the insulative layer 22 and conductive layer 24 as were present in FIG. 4 also apply in FIG. 5. Further, in FIG. 5, channel 14 contains an antistatic layer 27 on the interior surface of the container 10. The interior surface of the container 10 is that surface which may come in contact with the electronic components 12 or which is nearest to the electronic components 12. The addition of the antistatic layer 27 will provide an additional protection to the electronic components 12. The antistatic layer 27 will help prevent electrostatic charge buildup on the electronic components 12 such as that caused by a triboelectric charging and will allow a gradual dissipation of any previously accumulated electrostatic charge on the container 10. In a preferred embodiment, the antistatic layer 27 has a surface resistivity of from $10^7$ to $10^{14}$ ohms per square. Again, as with insulative layer 22 and conductive layer 24, antistatic layer 27 should be transparent to allow for the over-all transparency of the channel 14. The channel 14 should exhibit a minimum transparency of 40 percent visible light transmission and preferably a 70 percent visible light transmission.

While antistatic layer 27 has been shown as a separate layer it is to be recognized and understood that only the antistatic function is intended. That antistatic function may be achieved through either a surface treatment on the interior surface of the container 10 (i.e. a separate layer) or by the internally treating one of the other layers of the container 10 nearest the interior surface (e.g. insulative layer 22) with a material which makes the interior surface perform antistatically. The internal treatment is preferred because of durability.

Internal antistatic agents usually only make the surface antistatic since they derive their conductivity from absorbed ambient moisture. These agents include amines and quaternary ammonium compounds. An example of a suitable amine is HOSTASTAT FA-14, an ethoxylated alkyamine manufactured by American Hoechst Corporation. An example of quaternary ammonium compounds include MARKSTAT AL-33 by Witco and CYASTAT LS by American Cyanamid. In a preferred embodiment, CYASTAT LS is added to a polyvinylchloride insulative layer 22 forming the antistatic layer 27 on the interior surface. A preferred concentration is 2% by weight resulting in an average surface resistivity of $2 \times 10^{12}$ ohms per square.

FIG. 6 shows still another alternative embodiment of the construction of the channel 14 to form the container 10. As in FIG. 5, channel 14 in FIG. 6 has an insulative layer 22 and an internal antistatic layer 27. Insulative layer 22 and antistatic layer 27 are similar to the same layers in the construction illustrated in FIG. 5. Again, antistatic layer 27 is optional and is not required for an effective electrostatic shielded container 10. Further the channel 14 in FIG. 6 has a conductive film 28 affixed to insulative layer 22. Conductive film 28 is again transparent allowing for the over-all transparency of channel 14. Conductive film 28 provides the function of the conductive layer 24 in providing effective electrostatic shielding for the electronic components 12 (not shown). While in FIG. 6 the conductive film 28 is shown exterior to insulative layer 22, this particular orientation is not crucial and the opposite orientation is indeed possible. The exterior orientation of the conductive film 28 may allow for easier fabrication as will be subsequently illustrated.

In a preferred embodiment, the conductive film 28 may be composed of a plurality of layers containing both a conductive layer and an insulative layer. In this preferred embodiment, conductive film 28 would provide both the electrostatic shielding characteristics of a conductive layer and the direct coupling protection characteristics of an insulative layer. In such a preferred embodiment the additional insulative layer 22 may still be required to provide sufficient rigidity to allow the conductive film 14 to be formed into the desired shape for the container 10. Note, however, that where the conductive film 28 contains both conductive and insulative properties, it does not matter that insulative layer 22 is actually insulative since another insulative layer is provided within the conductive film and antistatic layer 27 may be optionally formed on the interior surface of the container 10.

FIG. 7 illustrates a cross-sectional view of a preferred embodiment of the conductive film 28 illustrated in FIG. 6. The preferred conductive film in FIG. 7 is constructed from an insulative layer 30 which forms a base film to which the other layers may be applied during fabrication. Conductive layer 32 may then be applied to one surface of insulative layer 30. If conductive film 28 is to be utilized on the exterior surface of a container 10, optionally a protective layer 34 may be applied to conductive layer 32 to protect conductive layer 32 from abrasion and corrosion. In a preferred embodiment, conductive film 28 also contains an adhesive 36 formed on the side of insulative layer 30 opposite from conductive layer 32. The purpose of adhesive 36 is to allow a means of affixing conductive film 28 to a rigid surface for example, insulative layer 22 of FIG. 6. Note that the particular orientation of the insulative layer 30 and the conductive layer 32 is of no electrical functional significance. A preferred construction for conductive film 28 is disclosed in U.S. Pat. No. 4,156,751, Yenni, Jr. et al, entitled Sheet Material For Forming Envelopes Used to Protect Electronic Components, issued May 29, 1979, which is hereby incorporated by reference. The conductive film described in Yenni, Jr. et al has an ultra-thin abrasion resistant layer similar to optional protective layer 34. Within the context of the present invention such abrasion resistant layer is optional. Further, the conductive film described in Yenni, Jr. et al discloses a certain surface resistivity as measured from the surface of the film. For the purposes of the present invention the surface resistivity specified is that surface resistivity of the conductive layer of the film disclosed in Yenni, Jr. et al. While it may be desirable, it is not required that that same surface resistivity or any particular surface resistivity be measurable from a surface of the film especially if the optional abrasion resistant layer is incorporated thereon.

FIGS. 8 through 10 show several alternate embodiments of a container 10 constructed using the conductive film 28. In all three figures, 8 through 10, conductive film 28 is applied using adhesive 36 to the exterior surface of an insulative layer 22 forming the channel 14. Also, in all three figures, channel 14 is formed in a general A-shape suitable for transporting dual in-line package (DIP) electronic components. This general A-shape has a top portion 38 along with a center rail 40 forming a recess 42 in the bottom of the container 10.

In FIG. 8, conductive film 28 is wrapped completely around the exterior surface of insulative layer 22 forming a container 10 which is completely transversely enveloped by conductive film 28. The overlap of the conductive film 28 in the recess 42 formed by the center rail 40 ensures that complete transverse electrostatic shielding is provided for the electronic components 12 (not shown) contained within the container 10.

The process of forming or wrapping the conductive film 28 to insulative layer 22 can be simplified by eliminating the overlap within the recess 42. This construction is illustrated in FIG. 9 which shows conductive film 28 having a gap in the recess 42 formed by the center rail 40. The non-overlaping of the conductive film 28 allows a simpler process and machinery for the automatic forming of the conductive film 28 around insulative layer 22. While conductive film 28 does not now completely transversely surround the electronic components 12 (not shown) the gap between the edges 44 and 46 of the conductive film 28 should not be so great so as to dilatariously affect the electrostatic shielding of the electronic components 12. The maximum gap between edges 44 and 46 depends upon the particular electrostatic sensitive electronic components 12 being contained and the environment to which they are subjected. Note that a straight line drawn connecting edges 44 and 46 of conductive film 28 along with the remainder of the conductive film 28 will completely transversely surround electronic components 12.

The maximum gap allowable between edges 44 and 46 was evaluated using a shielding test apparatus similar to that of ASTM F 365-73T. The apparatus consists of an isolated parallel plate capacitor placed inside a horizontally split, hollow metal cylinder. One cylinder half contains a capacitor input plate and the other half a 29 mm planar electronic component spaced at 0.065 inches (1.65 millimeters) with its leads grounded to closely simulate a container 10 similar to the container 10 illustrated in FIG. 1 containing a 29 mm electrostatic sensitive electronic component. A 3,000 volt discharge was made to the input plate which was connected to an electrostatic discharge (ESD) simulator consisting of a 200 picofarad capacitor and a 1,000 ohm resistor. A storage oscilloscope (Tektronix 7834 with a 7B80 time base) was used to record the transient voltage observed on the aluminum cap of the electronic component coupled to the oscilloscope with a P6009 probe having 10 megohms resistance to ground with a capacitance of 2.5 picofarads. A gap of 0.25 inch (6.35 millimeters) resulted in an observed voltage of approximately 20 volts while a 0.50 inch (12.7 millimeters) gap resulted in an observed voltage of approximately 50 volts. A one inch (25.4 millimeters) gap resulted in an observed voltage of approximately 115 volts. Based on these tests, it is preferred that the maximum gap be not more than one inch (25.4 millimeters) and, still preferably, be not more than 0.38 inches (9.65 millimeters).

FIG. 10 illustrates an alternative construction where the conductive film 28 does not completely surround electronic components 12. Edges 48 and 50 form a gap along the top portion 38 of the container 10. Again, the non-overlapping of the conductive layer 28 may simplify the process and machinery required to wrap conductive film 28 around insulative layer 22. Although conductive film 28 is transparent within the definition of allowing a minimum of 40 percent visible light transmission through channel 14, it is recognized that conductive film 28 may diminish the light transmission somewhat. Although with 40 percent visible light transmission the electronic components 12 would be visible within the container 10 and their type could be ascertained, the visibility of the type of the electronic components 12 could be increased where a gap in the conductive film 28 (formed by edges 48 and 50) is formed in the top portion 38 of the container 10. This construction is illustrated in FIG. 10. Still further, channel 14 could end at edges 48 and 50 forming an open slot in the top portion 38 of the container 10 creating unlimited visibility to the electronic components 12 contained therein. Further, in FIG. 10 conductive film 28 may be wrapped directly across the bottom of the container 10 without the necessity of it being formed into recess 42. This could be accomplished either by allowing the conductive film 28 not to contact insulative layer 22 at recess 42 or by forming another portion of insulative layer 22 across recess 42.

While the description and discussion of the container 10 and the cross-sectional geometries of the channel 14 have been mostly restricted to the packaging of dual in-line (DIP) electronic components and the resultant generally A-shape of channel 14, it is to be recognized and understood that other geometries of the channel 14 forming the container 10 may be readily utilized for not only DIP electronic components, but other forms of electronic components as well.

Figure 12:
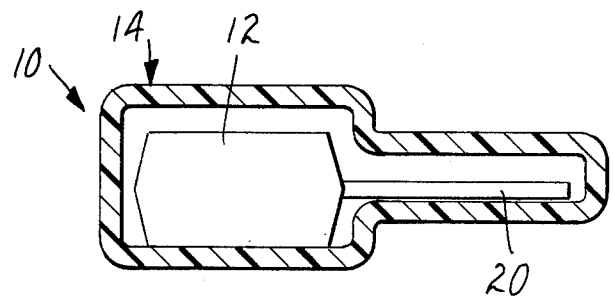
FIG. 12 is a cross-section of another alternative shape for the container of the present invention.
Figure 13:
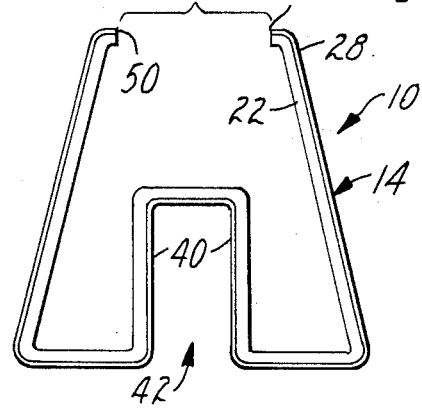
FIG. 13 is an illustration of an alternative construction of the container of the present invention.

FIGS. 11 and 12 illustrate two other basic cross-sectional shapes for the container 10. Both containers 10 in FIGS. 11 and 12 longitudinally contain the electrostatic sensitive electronic components 12 and both, as is preferred, prevent rotation of the electronic components 12 about the longitudinal axis of the container 10. The container 10 in FIG. 11 has a channel 14 of a substantially square cross-section for containing DIP components 12 having leads 20. The shape, of course, may be adjusted to rectangular depending upon the geometry of the electronic component 12 including the width of the body and the length and shape of the leads 20. The container 10 in FIG. 12 illustrates an exemplary cross-sectional shape for a container 10 intended for containing single in-line package (SIP) electronic components 12. In general, SIP electronic components 12 have only one row of leads 20 extending from its body portion. The container 10 has a channel 14 forming a generally rectangular shape around the body portion of the electronic components 12 integrally formed with an adjacent elongated portion formed around the leads 20. The alternate shapes for the containers 10 illustrated in FIGS. 11 and 12 are intended to be merely exemplary of the cross-sectional shapes for the container 10 of the present invention which may be used to house electronic components 12.

Thus, it can be seen that there has been shown and described a novel transparent container for electrostatic sensitive electronic components. It is to be understood, however, that various changes, modifications, and substitutions in the form of details of the described container can be made by those skilled in the art without departing from the scope of the invention as defined by the following claims.

What is claimed is:

1. A container adapted to receive a plurality of electrostatic sensitive electronic components, comprising:
   a rigid, transparent, elongated channel being open on at least one end;
   said channel having a transparent, insulative layer and a transparent, conductive layer at least partially transversely surrounding said insulative layer whereby direct coupling of electric potential or electrostatic discharge to said electronic components is prevented.

2. A container as in claim 1 wherein the interior surface of said channel is antistatic.

3. A container as in claim 2 wherein said channel has an exterior surface and which further comprises a transparent, protective layer on said exterior surface.

4. A container as in claim 2 wherein the interior surface of said channel has a surface resistivity of from $10^7$ to $10^{14}$ ohms per square.

5. A container as in claim 1 wherein said conductive layer has a surface resistivity of not more than $10^6$ ohms per square.

6. A container as in claim 1 wherein said insulative layer has a volume resistivity of at least $10^9$ ohm-centimeters.

7. A container as in claim 1 wherein said conductive layer only partially transversely surrounds said insulative layer, said conductive layer providing effective electrostatic shielding to said plurality of electrostatic sensitive electronic components.

8. A container as in claim 7 wherein said channel only partially transversely surrounds said plurality of electrostatic sensitive components.

9. A container as in claim 8 wherein said channel has an open slot running the length of said channel.

10. A container as in claim 1 wherein said channel and said conductive layer completely transversely surround said electrostatic sensitive components.

11. A container as in claim 1 wherein said channel has an interior surface and wherein said conductive layer is oriented opposite said insulative layer from said interior surface.

12. A container adapted to receive a plurality of electrostatic sensitive electronic components, comprising;
   a rigid, transparent, elongated channel being open on at least one end;
   said channel having a transparent, insulative layer and a transparent, conductive layer only partially transversely surrounding said plurality of electrostatic sensitive electronic components;
   said conductive layer having a longitudinal gap formed by edges of said conductive layer where said conductive layer only partially surrounds said plurality of eletrostatic sensitive electronic components, said gap having a width of not more than 25 millimeters, and wherein said conductive layer if continuous across said gap would completely transversely surround said components; and said conductive layer providing effective electrostatic shielding to said plurality of electrostatic sensitive electronic components.

13. A container adapted to receive a plurality of electrostatic sensitive electronic components, comprising:
   a rigid, transparent, insulative, elongated channel being open on at least one end; and
   a transparent, conductive film secured to said channel; said transparent, conductive film forming an effective electrostatic shield around said plurality of electrostatic sensitive electronic components.

14. A container as in claim 13 wherein said channel has an exterior surface and wherein said conductive film is secured to said exterior surface of said channel.

15. A container as in claim 14 wherein said channel has an interior surface and wherein said interior surface is antistatic.

16. A container as in claim 14 wherein said conductive film further comprises a transparent protective layer on the exterior surface of said conductive film.

17. A container as in claim 15 wherein said interior surface of said channel has a surface resistivity of from $10^7$ to $10^{14}$ ohms per square.

18. A container as in claim 13 wherein said conductive film has a surface resistivity of not more than $10^6$ ohms per square.

19. A container as in claim 13 wherein said channel has a volume resistivity of at least $10^9$ ohm-centimeters.

20. A container as in claim 13 wherein said film only partially transversely surrounds said plurality of electrostatic sensitive components.

21. A container as in claim 20 wherein said channel only partially transversely surrounds said plurality of electrostatic sensitive components.

22. A container as in claim 21 wherein said channel has an open slot running the length of said channel.

23. A container as in claim 13 wherein said channel and said conductive film completely transversely surround said electrostatic sensitive components.

24. A container adapted to receive a plurality of electrostatic sensitive electronic components, comprising:
   a rigid, transparent, insulative, elongated channel being open on at least one end; and
   a transparent, conductive film secured to said channel; said transparent, conductive film forming an effective electrostatic shield around said plurality of electrostatic sensitive electronic components;
   wherein said film only partially transversely surrounds said plurality of electrostatic sensitive components; and
   wherein said conductive layer has a longitudinal gap formed by edges of said conductive layer where said conductive layer only partially surrounds said plurality of electrostatic sensitive electronic components, said gap having a width of not more than 25 millimeters, and wherein said conductive layer if continuous across said gap would completely transversely surround said components.

* * * * *